United States Patent
Lee et al.

(10) Patent No.: US 8,771,529 B1
(45) Date of Patent: Jul. 8, 2014

(54) METHOD FOR IMPRINT LITHOGRAPHY

(75) Inventors: Kim Yang Lee, Fremont, CA (US); Bing Yen, Cupertino, CA (US); David Kuo, Palo Alto, CA (US); Koichi Wago, Sunnyvale, CA (US); Shih-Fu Lee, Fremont, CA (US); Dieter Weller, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 708 days.

(21) Appl. No.: 12/894,640

(22) Filed: Sep. 30, 2010

(51) Int. Cl.
*B44C 1/22* (2006.01)

(52) U.S. Cl.
USPC .................. 216/22; 216/33; 216/52; 216/54

(58) Field of Classification Search
USPC .......................................... 216/22, 33, 52, 54
See application file for complete search history.

(56) References Cited

U.S. PATENT DOCUMENTS

| | | | |
|---|---|---|---|
| 7,713,753 B2 | 5/2010 | Xiao et al. | |
| 7,758,981 B2* | 7/2010 | Albrecht | 428/826 |
| 2008/0113157 A1 | 5/2008 | Lee et al. | |
| 2008/0128944 A1 | 6/2008 | Wang et al. | |
| 2009/0034124 A1* | 2/2009 | Ichikawa et al. | 360/135 |
| 2010/0183957 A1* | 7/2010 | Wang et al. | 430/5 |
| 2010/0233514 A1* | 9/2010 | Umezawa et al. | 428/826 |
| 2012/0297856 A1* | 11/2012 | Keil et al. | 72/379.2 |

* cited by examiner

*Primary Examiner* — Binh X Tran

(57) ABSTRACT

A method of imprint lithography includes imprinting a first pattern with a first template on a first substrate of a lithographic template. A second pattern is imprinted with a second template on the substrate of the lithographic template. The first pattern and the second pattern at least partially overlap, thus forming a third pattern. The third pattern is lithographically formed on a second substrate with the lithographic template. In an embodiment, the first pattern is a concentric line pattern formed by thin film deposition. In an embodiment, the second pattern is a radial line pattern. In an embodiment the first pattern and the second pattern may have line frequency increased.

19 Claims, 14 Drawing Sheets

METHOD FOR IMPRINT LITHOGRAPHY

FIELD

Embodiments according to the present invention generally relate to imprint lithography.

BACKGROUND

Micro-fabrication involves the fabrication of very small structures, for example structures having features on the order of micro-meters or smaller. Lithography is a micro-fabrication technique used to create ultra-fine (sub-25 nm) patterns in thin film on a substrate. During imprint lithography, a mold having at least one protruding feature is pressed into the thin film. The protruding feature in the mold creates a recess in the thin film, thus creating an image of the mold. The thin film retains the image as the mold is removed. The mold may be used to imprint multiple thin films on different substrates.

BRIEF DESCRIPTION OF THE DRAWINGS

Embodiments of the present invention are illustrated by way of example, and not by way of limitation, in the figures of the accompanying drawings.

DETAILED DESCRIPTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

For expository purposes, the term "horizontal" as used herein refers to a plane parallel to the plane or surface of a substrate, regardless of its orientation. The term "vertical" refers to a direction perpendicular to the horizontal as just defined. Terms such as "above," "below," "bottom," "top," "side," "higher," "lower," "upper," "over," and "under" are referred to with respect to the horizontal plane.

Figure 1:
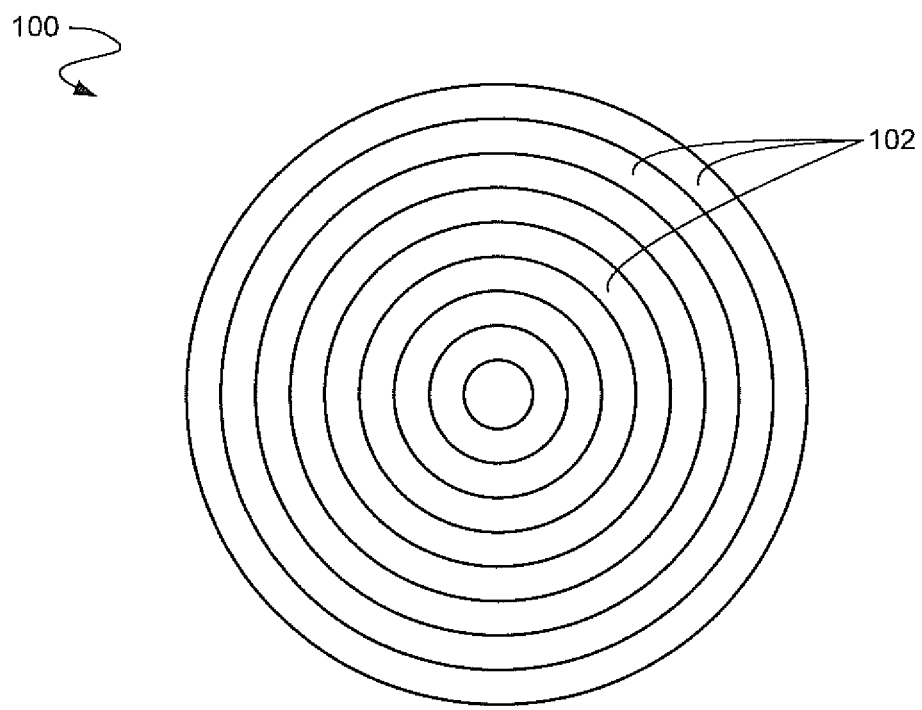
FIG. 1 is a top view of a template with concentric grooves according to an embodiment of the present invention.

FIG. 1 is a top view of a template 100 with concentric grooves 102 according to an embodiment of the present invention. The concentric grooves 102 may be produced by thin film deposition (See FIG. 2-FIG. 6) or by nano imprint lithography using frequency doubling (See FIG. 7-FIG. 16).

Figure 2:
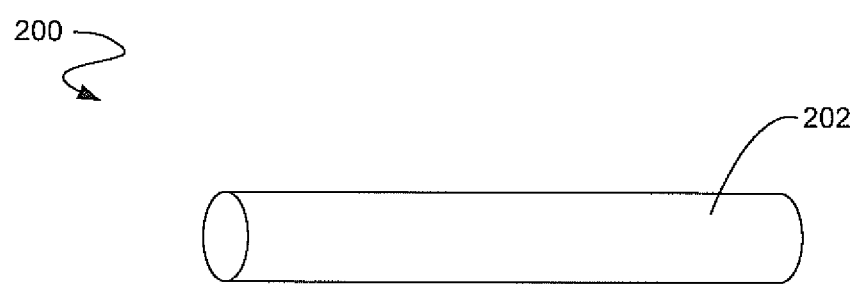
FIG. 2 is a perspective view of a concentric line template at an early stage of manufacture according to an embodiment of the present invention.

FIG. 2 is a perspective view of a concentric line template 200 at an early stage of manufacture according to an embodiment of the present invention. In an embodiment, the concentric line template 200 is the template 100 (See FIG. 1) with the concentric grooves 102 (See FIG. 1). A mandrel 202 is rotatable by a device, not shown.

Figure 3:
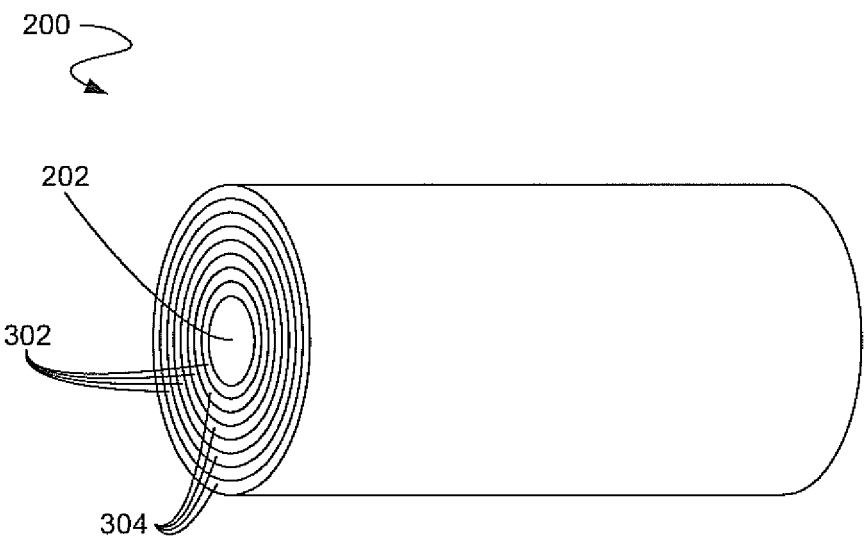
FIG. 3 is a perspective view of the concentric line template after first layers and second layers have been deposited according to an embodiment of the present invention.

FIG. 3 is a perspective view of the concentric line template 200 after first layers 302 and second layers 304 have been deposited according to an embodiment of the present invention. In order to deposit the first layers 302 and the second layers 304, the mandrel 202 is rotated and the first layers 302 and the second layers 304 are sequentially deposited. For example, first layer 302 is deposited on the mandrel 202. Second layer 304 is deposited on first layer 302. First layer 302 is deposited on second layer 304. Alternately depositing the first layers 302 and the second layers 304 is repeated until a predetermined number of layers are deposited.

The first layers 302 and the second layers 304 are deposited using thin film deposition techniques. Thus, the first layers 302 and the second layers 304 may be made very thin, for example less than or equal to 2 nm in thickness each. In addition, the first layers 302 may be a first material and the second layers 304 may be a second material. The first material and the second material may be of different metals or non-metals that allow for preferential removal. Thus, the first layers 302 or the second layers 304 may be removed with the other layers remaining. For example, in an embodiment the first layers 302 may be removed by etching and the second layers 304 will remain.

Figure 4:
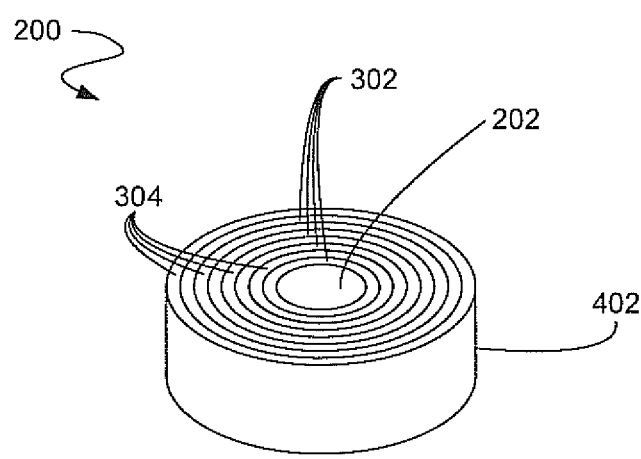
FIG. 4 is a perspective view of the concentric line template after dicing according to an embodiment of the present invention.

FIG. 4 is a perspective view of the concentric line template 200 after dicing according to an embodiment of the present invention. The mandrel 202, the first layers 302, and the second layers 304 are diced into a thin slice 402. In an embodiment, convention dicing methodology dices into a plurality of thin slices.

Figure 5:
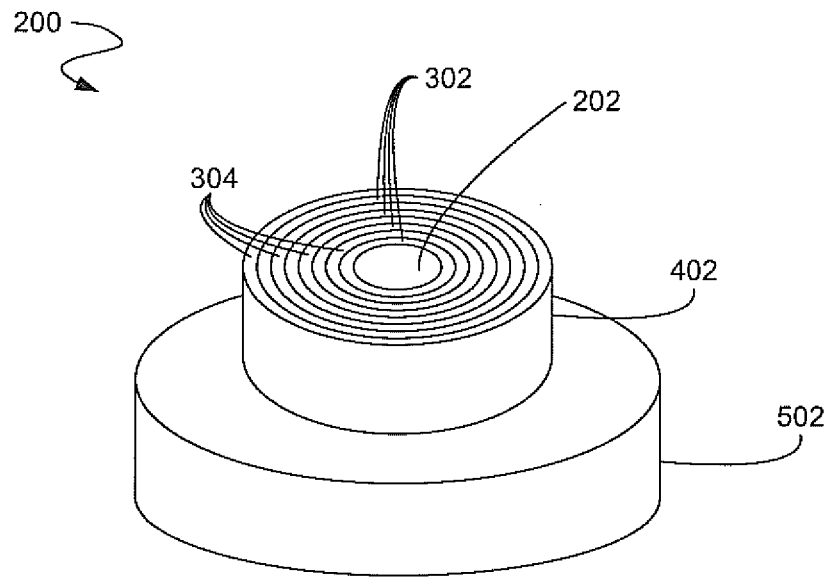
FIG. 5 is a perspective view of the concentric line template after bonding according to an embodiment of the present invention.

FIG. 5 is a perspective view of the concentric line template 200 after bonding according to an embodiment of the present invention. The thin slice 402 is bonded to a backing plate 502. In an embodiment, the thin slice 402 is polished after it is bonded to the backing plate 502.

Figure 6:
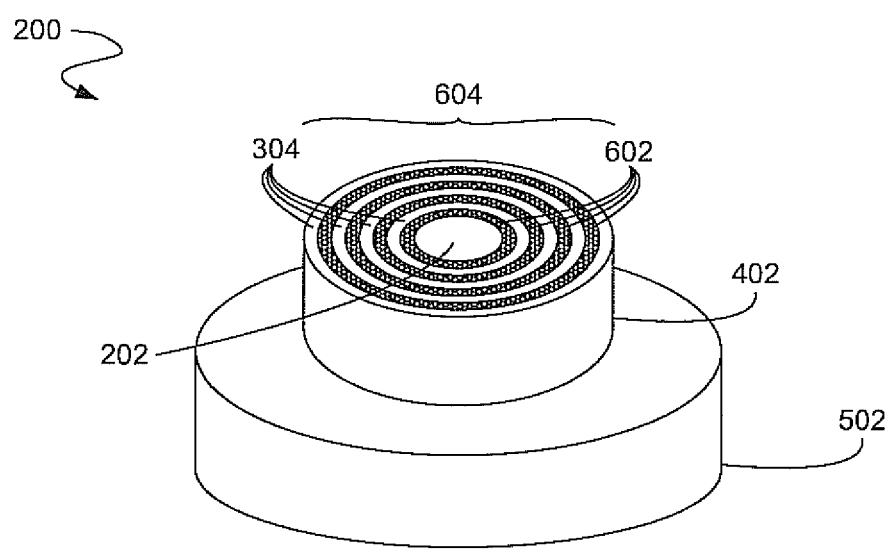
FIG. 6 is a perspective view of the concentric line template after etching according to an embodiment of the present invention.

FIG. 6 is a perspective view of the concentric line template 200 after etching according to an embodiment of the present invention. A preferential dry or wet etch has removed the first layers 302 (FIG. 5). The mandrel 202 and the second layers 304 of the thin slice 402 remain bonded to the backing plate 502. Removal of the first layers 302 (FIG. 5) forms concentric circular grooves 602 that are shaped by the second layers 304. The concentric circular grooves 602 and the second layers 304 form a concentric line pattern 604. The concentric line pattern 604 may serve as a template in subsequent processing below. In an alternate embodiment the preferential etch removes the second layers 304, and the first layers 302 (FIG. 5) remain.

Figure 7:
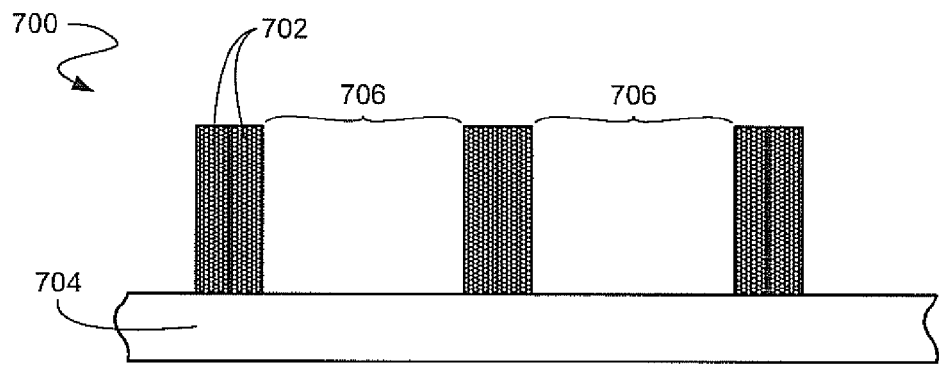
FIG. 7 is a simplified cross-sectional view of a line pattern at an early stage of manufacture according to an embodiment of the present invention.

FIG. 7 is a simplified cross-sectional view of a line pattern 700 undergoing frequency increasing at an early stage of manufacture according to an embodiment of the present invention. Frequency increasing is used to increase the frequency of line patterns. For example, in an embodiment frequency increasing may be used to double the frequency of the second layers 304 (FIG. 6) and the concentric circular grooves 602 (FIG. 6) of the concentric line pattern 604 (FIG. 6).

Resist areas 702 have been formed on a substrate 704, for example by lithographic processes or thin film deposition (FIG. 6). The resist areas 702 border first spaces 706 therebetween. The resist areas 702 form a form a resist pattern with a land to pitch ratio of 1/4.

Figure 8:
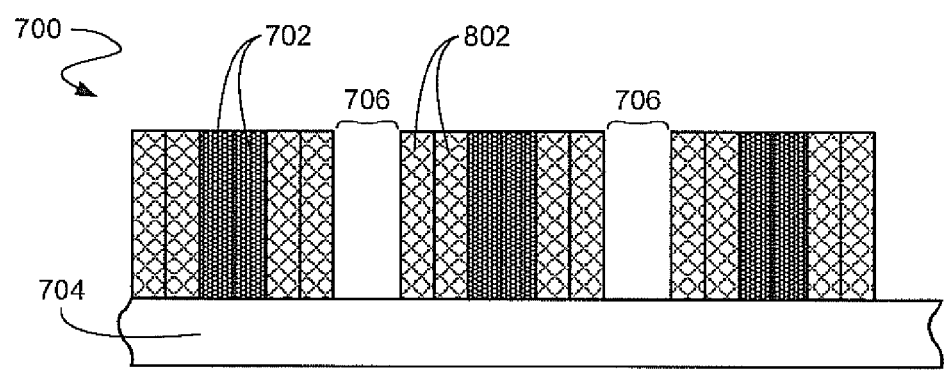
FIG. 8 is a simplified cross-sectional view of the line pattern after sidewall formation according to an embodiment of the present invention.

FIG. 8 is a simplified cross-sectional view of the line pattern 700 after sidewall formation according to an embodiment of the present invention. Sidewalls 802 have been formed on the substrate 704 and the sides of the resist areas 702.

In an embodiment, the sidewalls 802 are formed by first depositing sidewall material on the resist areas 702 and in the first spaces 706 on the substrate 704. For example the sidewall material may be deposited by chemical vapor deposition ("CVD"), and the sidewall material may be a dielectric material, for example SiN. Other materials, including other dielectric materials, may be used as the sidewall material without departing from the embodiments of the invention.

After the sidewall material has been deposited, sidewall material is removed from the top of the resist areas 702. In addition, a portion of the sidewall material is removed from the first spaces 706, thus forming the sidewalls 802 on the sides of the resist areas 702. For example, reactive ion etching ("RIE") can be used to anistropically etch the sidewall material to form the sidewalls 802. In an embodiment, the width of the sidewalls 802 is 1/4 the pitch, e.g. the same as the width of the resist areas 702.

Figure 9:
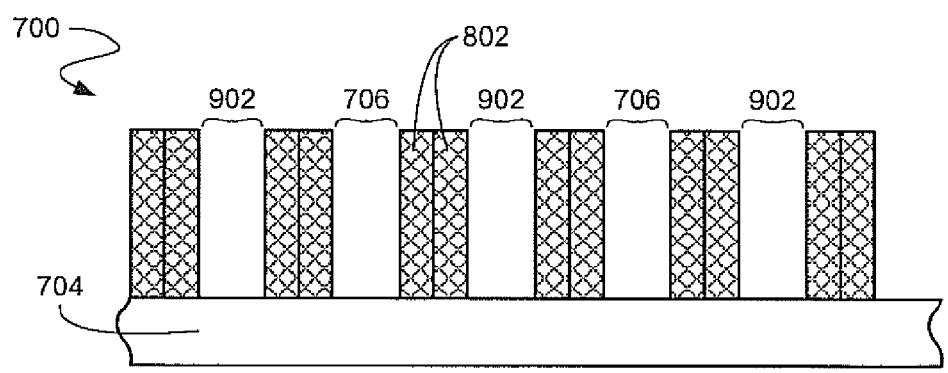
FIG. 9 is a simplified cross-sectional view of the line pattern after resist removal according to an embodiment of the present invention.

FIG. 9 is a simplified cross-sectional view of the line pattern 700 after resist removal according to an embodiment of the present invention. The resist areas 702 (FIG. 8) have been removed, for example by anisotropic etching, thus forming second spaces 902.

Figure 10:
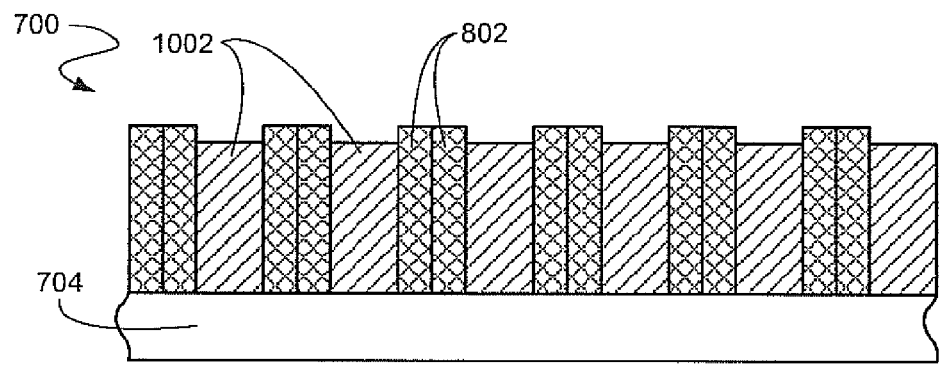
FIG. 10 is a simplified cross-sectional view of the line pattern after space filling according to an embodiment of the present invention.

FIG. 10 is a simplified cross-sectional view of the line pattern 700 after space filling according to an embodiment of the present invention. The first spaces 706 (FIG. 9) and the second spaces 902 (FIG. 9) have been filled with a conductive material 1002, for example Ni, having a width 1/4 the pitch. For example, electroplating may be used to fill the first spaces 706 (FIG. 9) and the second spaces 902 (FIG. 9). Thus, the line frequency of the line pattern 700 has doubled.

Figure 11:
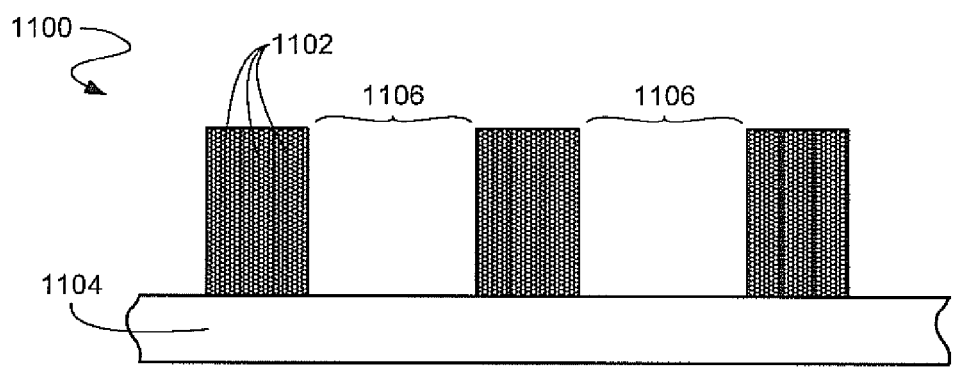
FIG. 11 is a simplified cross-sectional view of a line pattern at an early stage of manufacture according to an embodiment of the present invention.

FIG. 11 is a simplified cross-sectional view of a line pattern 1100 at an early stage of manufacture according to an embodiment of the present invention. The frequency increasing is used to increase the frequency of line patterns. For example, in an embodiment frequency increasing may be used to quadruple the frequency of the second layers 304 (FIG. 6) and the concentric circular grooves 602 (FIG. 6) of the concentric line pattern 604 (FIG. 6).

Resist areas 1102 have been formed on a substrate 1104, for example by lithographic processes or thin film deposition (FIG. 6). The resist areas 1102 border first spaces 1106 therebetween. The resist areas 1102 form a resist pattern with a land to pitch ratio of 3/8.

Figure 12:
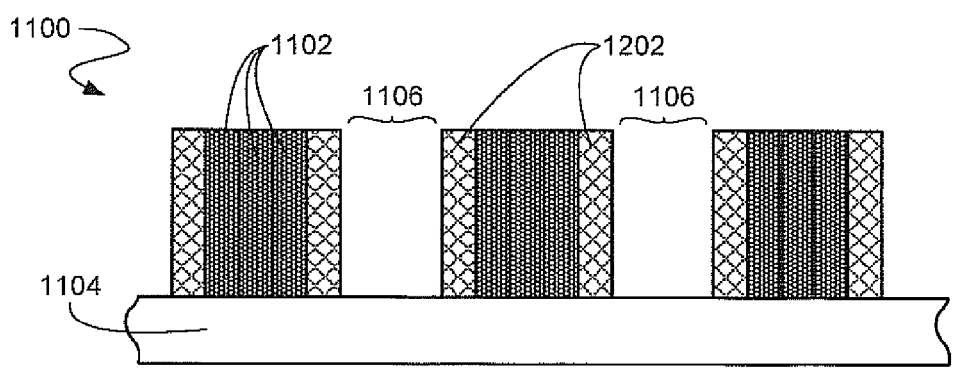
FIG. 12 is a simplified cross-sectional view of the line pattern after first sidewall formation according to an embodiment of the present invention.

FIG. 12 is a simplified cross-sectional view of the line pattern 1100 after first sidewall formation according to an embodiment of the present invention. First sidewalls 1202 have been formed on the substrate 1104 and the sides of the resist areas 1102, for example by lithographic processes.

In an embodiment the first sidewalls 1202 are formed by first depositing sidewall material on the resist areas 1102 and in the first spaces 1106 on the substrate 1104. For example the sidewall material may be deposited by chemical vapor deposition ("CVD"), and the sidewall material may be a dielectric material, for example SiN. Other materials, including other dielectric materials, may be used as the sidewall material without departing from the embodiments of the invention.

After the sidewall material has been deposited, sidewall material is removed from the top of the resist areas 1102. In addition, a portion of the sidewall material is removed from the first spaces 1106, thus forming the first sidewalls 1202 on the sides of the resist areas 1102. For example, reactive ion etching ("RIE") can be used to anistropically etch the sidewall material to form the first sidewalls 1202. In an embodiment, the width of the first sidewalls 1202 is 1/8 the pitch.

Figure 13:
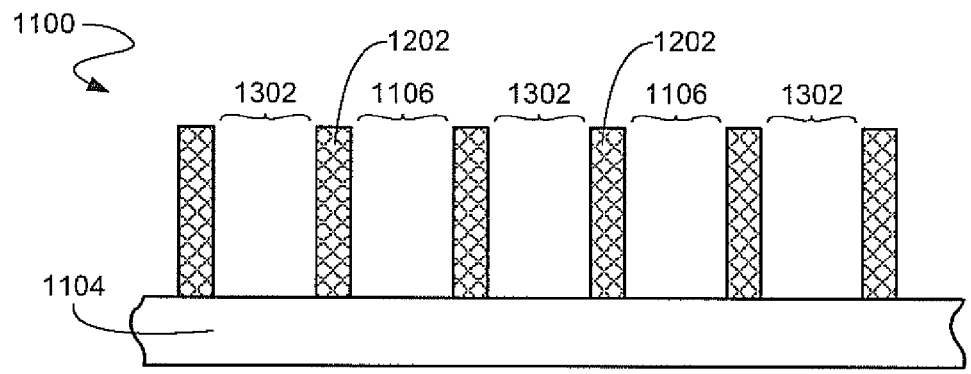
FIG. 13 is a simplified cross-sectional view of the line pattern after resist removal according to an embodiment of the present invention.

FIG. 13 is a simplified cross-sectional view of the line pattern 1100 after resist removal according to an embodiment of the present invention. The resist areas 1102 (FIG. 12) have been removed, for example by anisotropic etching, thus forming second spaces 1302.

Figure 14:
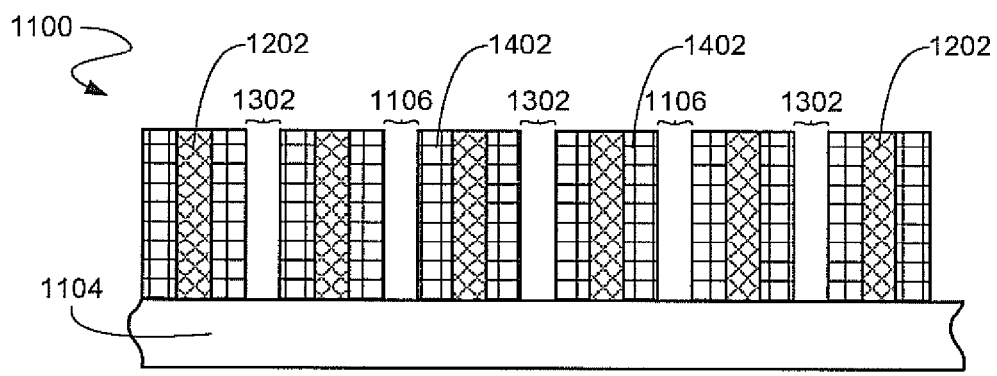
FIG. 14 is a simplified cross-sectional view of the line pattern after second sidewall formation according to an embodiment of the present invention.

FIG. 14 is a simplified cross-sectional view of the line pattern 1100 after second sidewall formation according to an embodiment of the present invention. Second sidewalls 1402 have been formed on the substrate 1104 and the sides of the first sidewalls 1202.

In an embodiment, the second sidewalls 1402 are formed by first depositing sidewall material on the first sidewalls 1202, in the first spaces 1106, in the second spaces 1302, and on the substrate 1104. For example the sidewall material may be deposited by chemical vapor deposition ("CVD"). In an embodiment, the second sidewall material is different from the first sidewall material. Thus, one set of sidewalls may be preferentially removed without removing the other set of sidewalls. For example, the first sidewalls 1202 may consist of SiN and the second sidewalls 1402 may be $SiO_2$. Other materials, including other dielectric materials, may be used as the sidewall material without departing from the embodiments of the invention.

After the second sidewall material has been deposited, second sidewall material is removed from the top of the first sidewalls 1202. In addition, a portion of the second sidewall material is removed from the first spaces 1106 and the second spaces 1302, thus forming the second sidewalls 1402 on the sides of the first sidewalls 1202. For example, reactive ion etching ("RIE") can be used to anistropically etch the second sidewall material to form the second sidewalls 1402. In an embodiment, the width of the second sidewalls 1402 is 1/8 the pitch.

Figure 15:
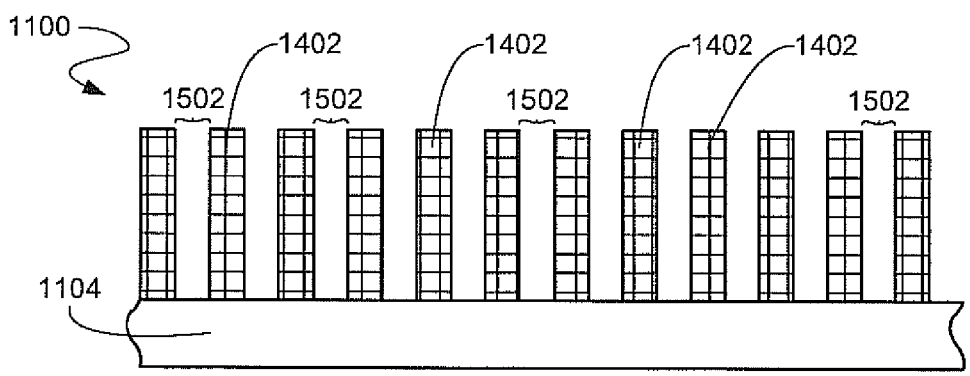
FIG. 15 is a simplified cross-sectional view of the line pattern after first sidewall removal according to an embodiment of the present invention.

FIG. 15 is a simplified cross-sectional view of the line pattern 1100 after first sidewall removal according to an embodiment of the present invention. The first sidewalls 1202 (FIG. 14) have been selectively removed, for example by etching, leaving the second sidewalls 1402 and a plurality of spaces 1502 between the second sidewalls 1402.

Figure 16:
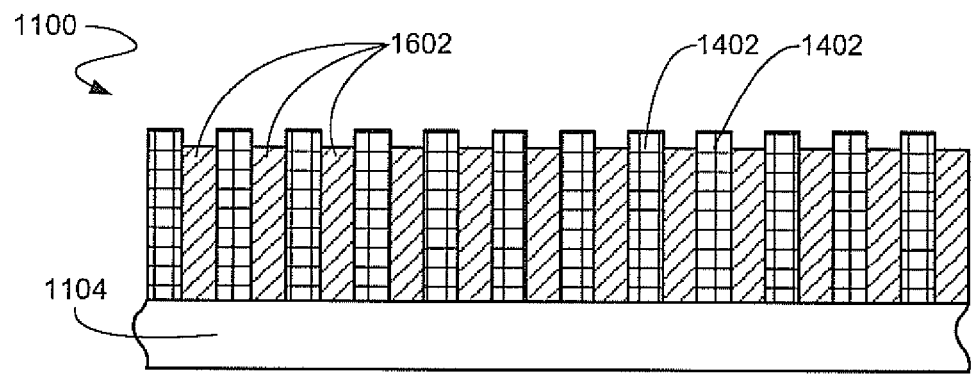
FIG. 16 is a simplified cross-sectional view of the line pattern after space filling according to an embodiment of the present invention.

FIG. 16 is a simplified cross-sectional view of the line pattern 1100 after space filling according to an embodiment of the present invention. The plurality of spaces 1502 (FIG. 15) have been filled with a conductive material 1602, for example Ni, having a width 1/8 the pitch. For example, electroplating may be used to fill the plurality of spaces 1502 (FIG. 15). Thus, the line frequency of the line pattern 1100 has quadrupled.

The thin film deposition and the frequency increasing may be used to create templates of periodic arrays of very small and uniform dots. The individual dot geometry may exhibit a variety of shapes, such as round, square, diamond, etc. The dot array forms a periodic structure, similar to the lattice in a single crystal, in a two-dimensional plane.

Figure 17:
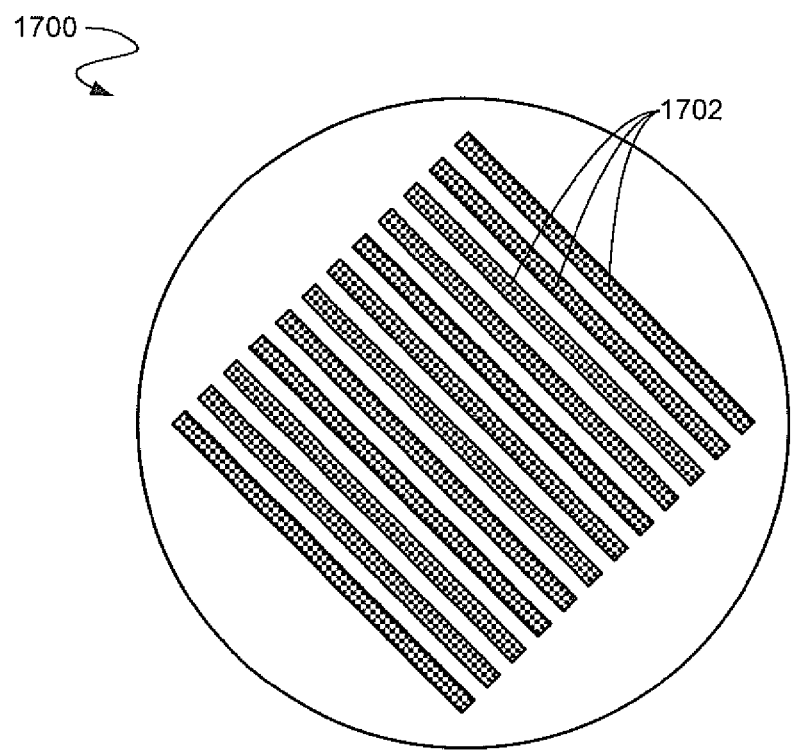
FIG. 17 is a simplified plan view of a portion of a substrate undergoing multi-step imprinting at an early stage of manufacture according to an embodiment of the present invention.

FIG. 17 is a simplified plan view of a portion of a substrate 1700 undergoing multi-step imprinting at an early stage of manufacture according to an embodiment of the present invention. A concentric line pattern 1702 has been imprinted in the substrate 1700 using a first template (not shown) formed by thin film deposition (FIG. 6). In an embodiment, frequency increasing, described above, may have been used to increase the frequency of the concentric line pattern on the template.

Figure 18:
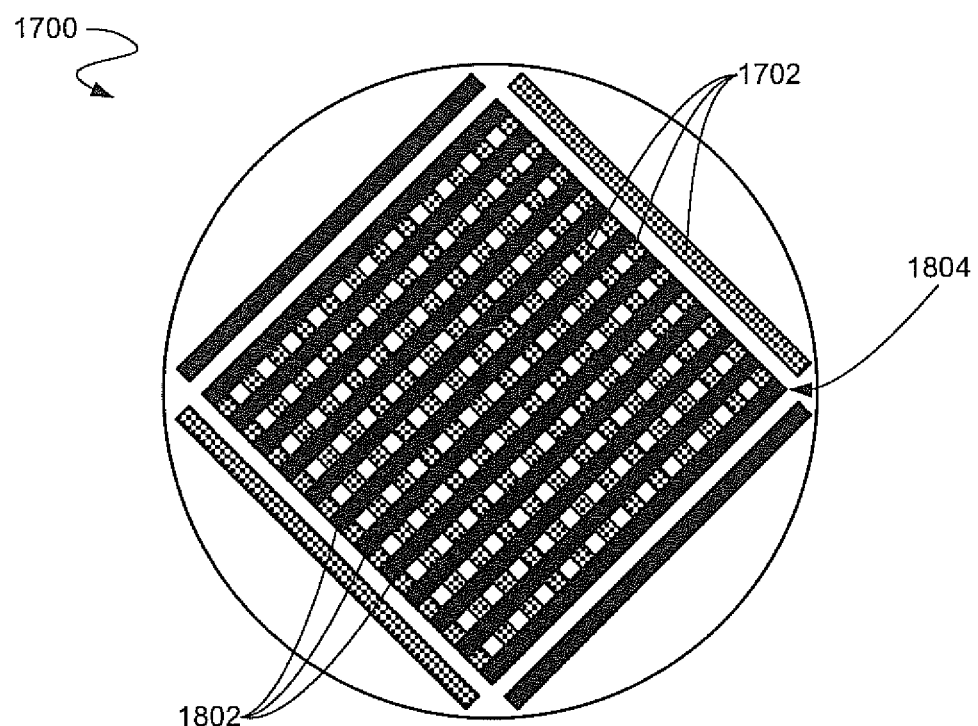
FIG. 18 is a simplified plan view of the substrate after radial line imprinting, according to an embodiment of the present invention.

FIG. 18 is a simplified plan view of the substrate 1700 after radial line imprinting, according to an embodiment of the present invention. A radial line pattern 1802 has been imprinted in the substrate 1700 using a second template (not shown). The radial line pattern 1802 at least partially overlaps the concentric line pattern 1702 and is arranged at an oblique angle to the substrate 1700. The radial line pattern 1802 may have been formed in the second template, for example, by e-beam lithography. In an embodiment, frequency increasing, described above, may have been used to increase the frequency of the radial line pattern on the second template.

Thus, multi-step imprinting has formed a third pattern 1804 on the substrate 1700. The third pattern 1804 is a high resolution cross-hatched pattern that can be used as a template in further processing.

Magnetic storage media are widely used in various applications, particularly in the computer industry for data storage and retrieval applications, as well as for storage of audio and video signals. Perpendicular magnetic recording media, for example hard disc drive storage devices, include recording media with a perpendicular anisotropy in the magnetic layer. In perpendicular magnetic recording media, residual magnetization is formed in a direction perpendicular to the surface of the magnetic medium, typically by a layer of a magnetic material on a substrate.

A perpendicular recording disc drive head typically includes a trailing write pole, and a leading return or opposing pole magnetically coupled to the write pole. In addition, an electrically conductive magnetizing coil surrounds the yoke of the write pole. During operation, the recording head flies above the magnetic recording medium by a distance referred to as the fly height. To write to the magnetic recording medium, the magnetic recording medium is moved past the recording head so that the recording head follows the tracks of the magnetic recording medium, with the magnetic recording medium first passing under the return pole and then passing under the write pole. Current is passed through the coil to create magnetic flux within the write pole. The magnetic flux passes from the write pole tip, through the hard magnetic recording track, into the soft underlayer, and across to the return pole. In addition to providing a return path for the magnetic flux, the soft underlayer produces magnetic charge images of the magnetic recording layer, increasing the magnetic flux and increasing the playback signal. The current can be reversed, thereby reversing the magnetic field and reorienting the magnetic dipoles.

The perpendicular recording medium is a continuous layer of discrete, contiguous magnetic crystals or domains. Within the continuous magnetic layer, discrete information is stored in individual bits. The individual bits are magnetically oriented positively or negatively, to store binary information. The number of individual bits on the recording medium is a function of the areal density. As areal densities increase, the amount of information stored on the recording medium also increases. Manufacturers strive to satisfy the ever-increasing consumer demand for higher capacity hard drives by increasing the areal density.

High density perpendicular recording media use carefully balanced magnetic properties. These carefully balanced magnetic properties include sufficiently high anisotropy (perpendicular magnetic orientation) to ensure thermal stability, resist erasure, and function effectively with modern disc drive head designs; and grain-to-grain uniformity of magnetic properties sufficient to maintain thermal stability and minimum switching field distribution (SFD).

As recording densities increase, smaller grain structures help to maintain the number of magnetic particles in a bit at a similar value. Smaller grain structures are easier to erase, requiring higher anisotropy to maintain thermal stability, and making writability worse. Further, when individual storage bits within magnetic layers of magnetic recording media are reduced in size, they store less energy making it easier for the bits to lose information. Also, as individual weaker bits are placed closer together, it is easier for continuous read/write processes and operating environments to create interference within and between the bits. This interference disrupts the read/write operations, resulting in data loss.

The magnetic layers are designed as an ordered array of uniform islands, each island storing an individual bit. This is referred to as bit patterned media. By eliminating the continuous magnetic layer and restricting the bits to discrete magnetic islands, interference is reduced and areal densities are increased. However, high areal density bit patterned media (e.g., >500 Gbpsi) demands high anisotropy of the magnetic material in the islands.

Methods and media structures are described herein, which embodiments of the present invention as described above, optimize anisotropy for bit patterned magnetic recording media. It is appreciated that magnetic recording media as discussed herein may be utilized with a variety of systems including disc drive memory systems, etc.

Figure 19:
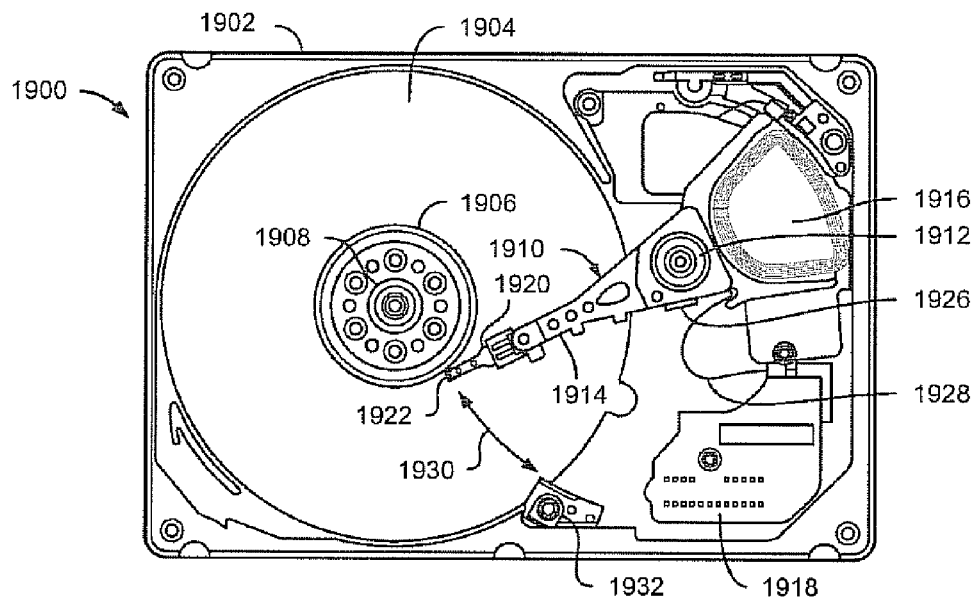
FIG. 19 is a data storage device in which embodiments of the present invention can be implemented to form bit-patterned media.

FIG. 19 is a data storage device in which embodiments of the present invention can be implemented to form bit-patterned media. FIG. 19 is a plan view of an exemplary disc drive 1900. The disc drive 1900 generally includes a base plate 1902 and a cover (not shown) that may be disposed on the base plate 1902 to define an enclosed housing for various disc drive components. The disc drive 1900 includes one or more data storage discs 1904 of computer-readable data storage media. Typically, both of the major surfaces of each data storage disc 1904 include a plurality of concentrically disposed tracks for data storage purposes. Each data storage disc 1904 is mounted on a hub or spindle 1906, which in turn is rotatably interconnected with the base plate 1902 and/or cover. Multiple data storage discs 1904 are typically mounted in vertically spaced and parallel relation on the spindle 1906. A spindle motor 1908 rotates the data storage discs 1904 at an appropriate rate.

The disc drive 1900 also includes an actuator arm assembly 1910 that pivots about a pivot bearing 1912, which in turn is rotatably supported by the base plate 1902 and/or cover. The actuator arm assembly 1910 includes one or more individual rigid actuator arms 1914 that extend out from near the pivot bearing 1912. Multiple actuator arms 1914 are typically disposed in vertically spaced relation, with one actuator arm 1914 being provided for each major data storage surface of each data storage disc 1904 of the disc drive 1900. Other types of actuator arm assembly configurations could be utilized as well, such as an "E" block having one or more rigid actuator arm tips or the like that cantilever from a common structure. Movement of the actuator arm assembly 1910 is provided by an actuator arm drive assembly, such as a voice coil motor 1916 or the like. The voice coil motor 1916 is a magnetic assembly that controls the operation of the actuator arm assembly 1910 under the direction of control electronics 1918.

A load beam or suspension 1920 is attached to the free end of each actuator arm 1914 and cantilevers therefrom. Typically, the suspension 1920 is biased generally toward its corresponding data storage disc 1904 by a spring-like force. A slider 1922 is disposed at or near the free end of each suspension 1920. What is commonly referred to as the read/write head (e.g., transducer) is appropriately mounted as a head unit (not shown) under the slider 1922 and is used in disc drive read/write operations. The head unit under the slider 1922 may utilize various types of read sensor technologies such as anisotropic magnetoresistive (AMR), giant magnetoresistive (GMR), tunneling magnetoresistive (TuMR), other magnetoresistive technologies, or other suitable technologies.

The head unit under the slider 1922 is connected to a preamplifier 1926, which is interconnected with the control electronics 1918 of the disc drive 1900 by a flex cable 1928 that is typically mounted on the actuator arm assembly 1910. Signals are exchanged between the head unit and its corresponding data storage disc 1904 for disc drive read/write operations. In this regard, the voice coil motor 1916 is utilized to pivot the actuator arm assembly 1910 to simultaneously move the slider 1922 along a path 1930 and across the corresponding data storage disc 1904 to position the head unit at the appropriate position on the data storage disc 1904 for disc drive read/write operations.

When the disc drive 1900 is not in operation, the actuator arm assembly 1910 is pivoted to a "parked position" to dispose each slider 1922 generally at or beyond a perimeter of its corresponding data storage disc 1904, but in any case in vertically spaced relation to its corresponding data storage disc 1904. In this regard, the disc drive 1900 includes a ramp assembly 1932 that is disposed beyond a perimeter of the data storage disc 1904 to both move the corresponding slider 1922 vertically away from its corresponding data storage disc 1904 and to also exert somewhat of a retaining force on the actuator arm assembly 1910.

Figure 20:
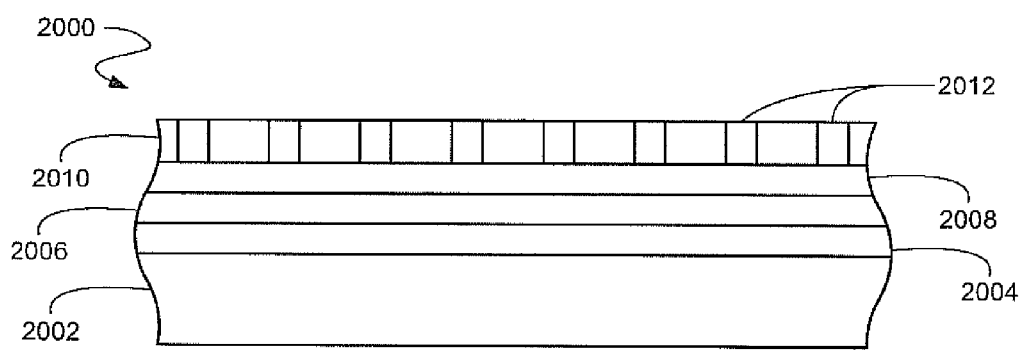
FIG. 20 is a simplified cross-sectional view of a perpendicular magnetic recording medium, which may be used for the data storage disc (FIG. 19).

FIG. 20 is a simplified cross-sectional view of a perpendicular magnetic recording medium 2000, which may be used for the data storage disc 1904 (FIG. 19). The perpendicular magnetic recording medium 2000 is an apparatus including multiple layers established upon a substrate 2002. A seed layer 2008 is a layer that is established overlying the substrate. A base layer 2010 is a layer that is established overlying the seed layer 2008. Perpendicular magnetic recording islands 2012 are recording areas that are established in the base layer 2010 and on the seed layer 2008.

The substrate 2002 can be fabricated from materials known to those skilled in the art to be useful for magnetic recording media for hard disc storage devices. For example, the substrate 2002 may be fabricated from aluminum (Al) coated with a layer of nickel phosphorous (NiP). However, it will be appreciated that the substrate 2002 can also be fabricated from other materials such as glass and glass-containing materials, including glass-ceramics. The substrate 2002 may have a smooth surface upon which the remaining layers can be deposited.

In a further embodiment, a buffer layer 2004 is established overlying the substrate 2002, a soft underlayer 2006 is established overlying the buffer layer 2004, and the seed layer 2008 is overlying the soft underlayer 2006. The buffer layer 2004 can be established from elements such as Tantalum (Ta). The soft underlayer 2006 can be established from soft magnetic materials such as CoZrNb, CoZrTa, FeCoB and FeTaC. The soft underlayer 2006 can be formed with a high permeability and a low coercivity. For example, in an embodiment the soft underlayer 2006 has a coercivity of not greater than about 10 oersteds (Oe) and a magnetic permeability of at least about 50. The soft underlayer 2006 may comprise a single soft underlayer or multiple soft underlayers, and may be separated by spacers. If multiple soft underlayers are present, the soft underlayers can be fabricated from the same soft magnetic material or from different soft magnetic materials.

In the embodiment illustrated, the seed layer 2008 is disposed on the soft underlayer 2006. The seed layer 2008 can be established, for example, by physical vapor deposition (PVD) or chemical vapor deposition (CVD) from noble metal materials such as, for example, Ru, Ir, Pd, Pt, Os, Rh, Au, Ag or other alloys. The use of these materials results in desired growth properties of the perpendicular magnetic recording islands 2012.

The perpendicular magnetic recording islands 2012 as described herein may be formed within the base layer 2010 and on the seed layer 2008 according to the embodiments of the present invention. The perpendicular magnetic recording islands 2012 can be established to have an easy magnetization axis (e.g., the C-axis) that is oriented perpendicular to the surface of the perpendicular magnetic recording medium 2000. Useful materials for the perpendicular magnetic recording islands 2012 include cobalt-based alloys with a hexagonal close packed (hcp) structure. Cobalt can be alloyed with elements such as chromium (Cr), platinum (Pt), boron (B), niobium (Nb), tungsten (W) and tantalum (Ta).

The perpendicular magnetic recording medium 2000 can also include a protective layer (not shown) on top of the perpendicular magnetic recording islands 2012 and/or the base layer 2010, such as a protective carbon layer, and a lubricant layer disposed over the protective layer. These layers are adapted to reduce damage from the read/write head interactions with the recording medium during start/stop operations.

Figure 21:
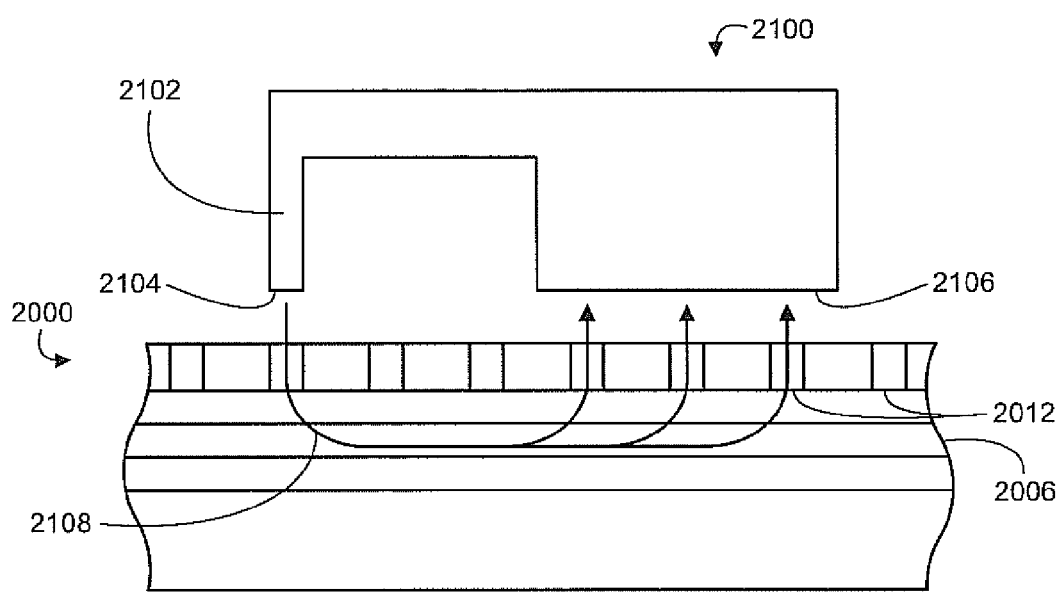
FIG. 21 is a simplified cross-sectional view of a portion of the perpendicular magnetic recording medium with a head unit.

FIG. 21 is a simplified cross-sectional view of a portion of the perpendicular magnetic recording medium 2000 with a head unit 2100. During the writing process, a perpendicular write head 2102 flies or floats above the perpendicular magnetic recording medium 2000. The perpendicular write head 2102 includes a write pole 2104 coupled to an auxiliary pole 2106. The arrows shown indicate the path of a magnetic flux 2108, which emanates from the write pole 2104 of the perpendicular write head 2102, entering and passing through at least one perpendicular magnetic recording island 2012 in the region below the write pole 2104, and entering and traveling within the soft underlayer 2006 for a distance. The magnetically soft underlayer 2006 serves to guide magnetic flux emanating from the head unit 2100 through the recording island 2012, and enhances writability. As the magnetic flux 2108 travels towards and returns to the auxiliary pole 2106, the magnetic flux 2108 disperses.

The magnetic flux 2108 is concentrated at the write pole 2104, and causes the perpendicular magnetic recording island 2012 under the write pole 2104 to magnetically align according to the input from the write pole 2104. As the magnetic flux 2108 returns to the auxiliary pole 2106 and disperses, the magnetic flux 2108 may again encounter one or more perpendicular magnetic recording islands 2012. However, the magnetic flux 2108 is no longer concentrated and passes through the perpendicular magnetic recording islands 2012, without detrimentally affecting the magnetic alignment of the perpendicular magnetic recording islands 2012.

Figure 22:
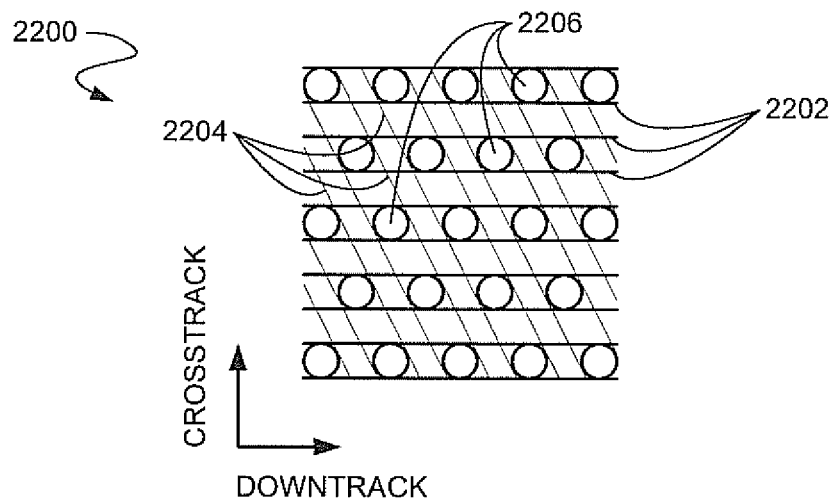
FIG. 22 is a simplified plan view of a portion of a perpendicular magnetic recording medium template according to an embodiment of the present invention, which may be used to imprint the data storage disc (FIG. 19) during manufacture.

FIG. 22 is a simplified plan view of a portion of a perpendicular magnetic recording medium template 2200 according to an embodiment of the present invention, which may be used to imprint the data storage disc 1904 (FIG. 19) during manufacture. The perpendicular magnetic recording medium template 2200 has been fabricated by dual imprinting. Concentric line features 2202 have been imprinted with a concentric line template (not shown). In an embodiment, the concentric line template may be fabricated by thin film deposition (FIG. 6). In addition, positive radial line features 2204 have been imprinted with a positive oblique radial line template (not shown). In an embodiment, the line features on the concentric line template and the positive oblique radial line template have had the line density increased by frequency increasing (FIG. 10 or FIG. 16).

Thus, the concentric line features 2202 and the positive radial line features 2204 form a staggered array 2206 in the perpendicular magnetic recording medium template 2200. The staggered array 2206 in the perpendicular magnetic recording medium template 2200 may be used to form the perpendicular magnetic recording islands 2012 (FIG. 20). Furthermore in an alternate embodiment (not shown), a radial line template may have a line arrangement that forms an aligned array in a perpendicular magnetic recording medium template.

Figure 23:
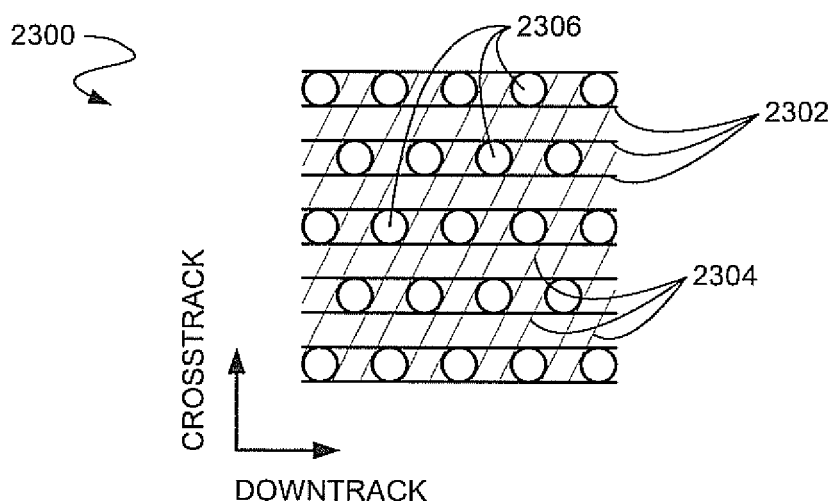
FIG. 23 is a simplified plan view of a portion of a perpendicular magnetic recording medium template according to an embodiment of the present invention, which may be used to imprint the data storage disc (FIG. 19) during manufacture.

FIG. 23 is a simplified plan view of a portion of a perpendicular magnetic recording medium template 2300 according to an embodiment of the present invention, which may be used to imprint the data storage disc 1904 (FIG. 19) during manufacture. The perpendicular magnetic recording medium template 2300 has been fabricated by dual imprinting. Concentric line features 2302 have been imprinted with a concentric line template (not shown). In an embodiment, the concentric line template may be fabricated by thin film deposition (FIG. 6). In addition, negative radial line features 2304 have been imprinted with a negative oblique radial line template (not shown). In an embodiment, the line features on the concentric line template and the negative oblique radial line template have had the line density increased by the frequency increasing (FIG. 10 or FIG. 16).

Thus, the concentric line features 2302 and the negative radial line features 2304 form a staggered array 2306 in the perpendicular magnetic recording medium template 2300. The staggered array 2306 in the perpendicular magnetic recording medium template 2300 may be used to form the perpendicular magnetic recording islands 2012 (FIG. 20).

Figure 24:
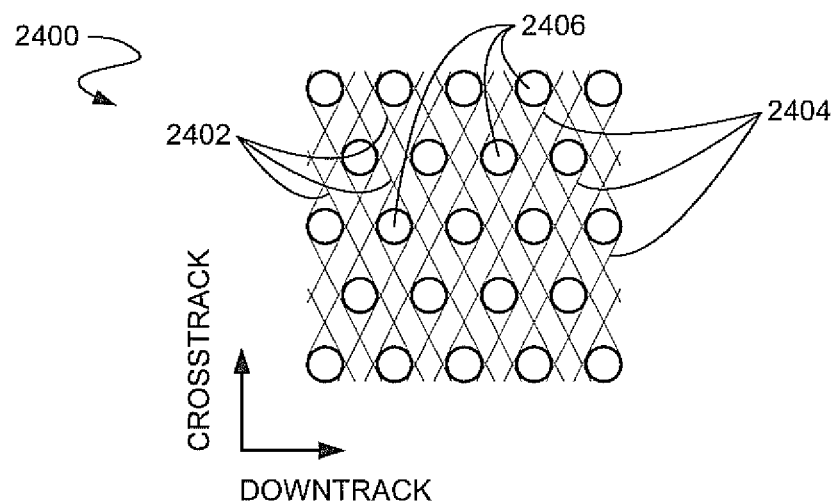
FIG. 24 is a simplified plan view of a portion of a perpendicular magnetic recording medium template according to an embodiment of the present invention, which may be used to imprint the data storage disc (FIG. 19) during manufacture.

FIG. 24 is a simplified plan view of a portion of a perpendicular magnetic recording medium template 2400 according to an embodiment of the present invention, which may be used to imprint the data storage disc 1904 (FIG. 19) during manufacture. The perpendicular magnetic recording medium template 2400 has been fabricated by dual imprinting. Positive radial line features 2402 have been imprinted with a positive oblique radial line template (not shown). In addition, negative radial line features 2404 have been imprinted with a negative oblique radial line template (not shown). In an embodiment, the line features on the positive oblique radial line template and the negative oblique radial line template have had the line density increased by frequency increasing (FIG. 10 or FIG. 16).

Thus, the positive radial line features 2402 and the negative radial line features 2404 form a staggered array 2406 in the perpendicular magnetic recording medium template 2400. The staggered array 2406 in the perpendicular magnetic recording medium template 2400 may be used to form the perpendicular magnetic recording islands 2012 (FIG. 20).

Figure 25:
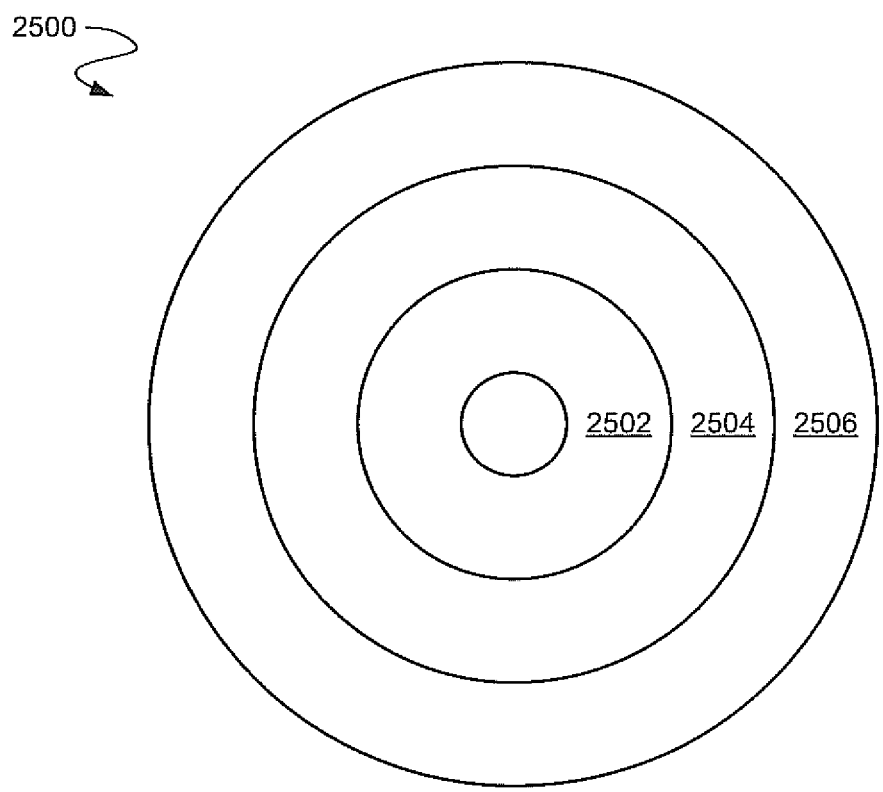
FIG. 25 is a simplified plan view of a portion of a perpendicular magnetic recording medium template according to an embodiment of the present invention, which may be used to imprint the data storage disc (FIG. 19) during manufacture.

FIG. 25 is a simplified plan view of a portion of a perpendicular magnetic recording medium template 2500 according to an embodiment of the present invention, which may be used to imprint the data storage disc 1904 (FIG. 19) during manufacture. In an embodiment, the perpendicular magnetic recording medium template 2500 has been divided into a first radial zone 2502, a second radial zone 2504, and a third radial zone 2506. In alternate embodiments, any number of radial zones may be used.

In an embodiment, different concentric line templates and/or radial line templates are used to imprint the first radial zone 2502, the second radial zone 2504, and the third radial zone 2506. The templates are selected such that within each zone, array density maintains constant angular and radial pitch. As a result, array density within a zone decreases as radius increases. Therefore in an embodiment, the angular pitch of each zone is adjusted to maintain an array density that is nearly the same as the previous zone.

Figure 26:
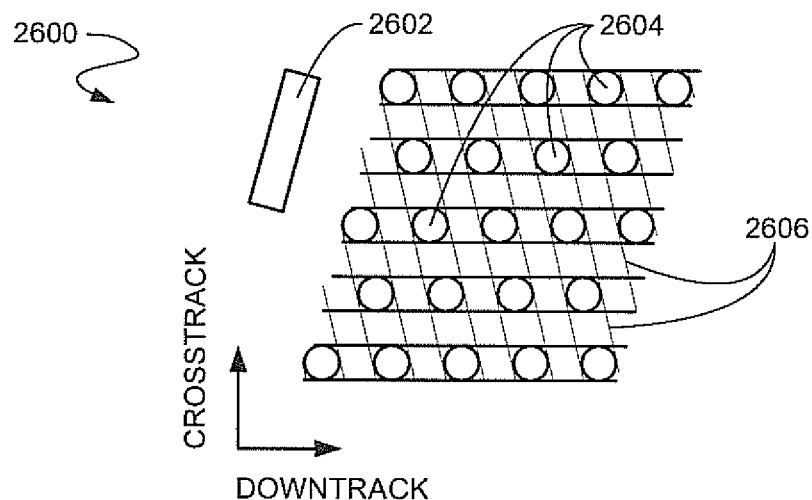
FIG. 26 is a simplified plan view of a portion of a perpendicular magnetic recording medium template according to an embodiment of the present invention, which may be used to imprint the data storage disk (FIG. 19) during manufacture.

FIG. 26 is a simplified plan view of a portion of a perpendicular magnetic recording medium template 2600 according to an embodiment of the present invention, which may be used to imprint the data storage disk 1904 (FIG. 19) during manufacture. As a head 2602 traverses a bit arrangement in the downtrack direction, the head 2602 experiences different head skew effects at different radial zones of a disk.

In an embodiment, an array 2604 is skewed to accommodate the head skew effects at an outer dimension of a disk. An oblique line pattern 2606 has an angle design as a function of the skew angle that occurs at different radii. Thus, the oblique line pattern 2606 is varied to have different angles as a function of the skew angle.

Figure 27:
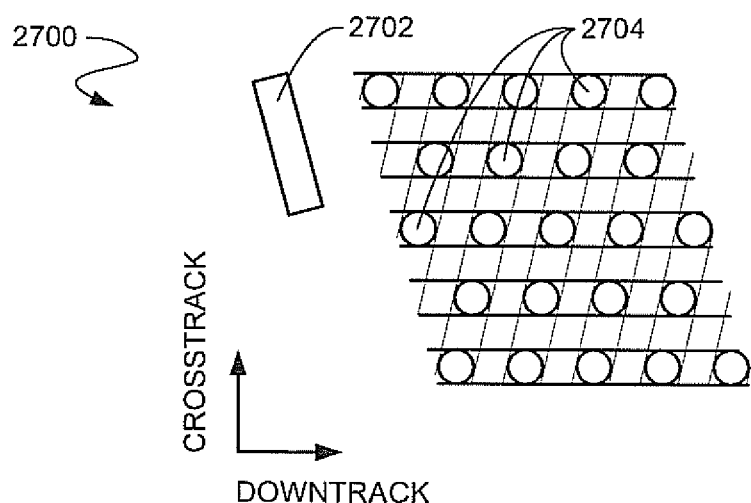
FIG. 27 is a simplified plan view of a portion of a perpendicular magnetic recording medium template according to an embodiment of the present invention, which may be used to imprint the data storage disk (FIG. 19) during manufacture.

FIG. 27 is a simplified plan view of a portion of a perpendicular magnetic recording medium template 2700 according to an embodiment of the present invention, which may be used to imprint the data storage disk 1904 (FIG. 19) during manufacture. In an embodiment, an array 2704 is skewed to accommodate the head skew effects at an inner dimension of a disk.

Figure 28:
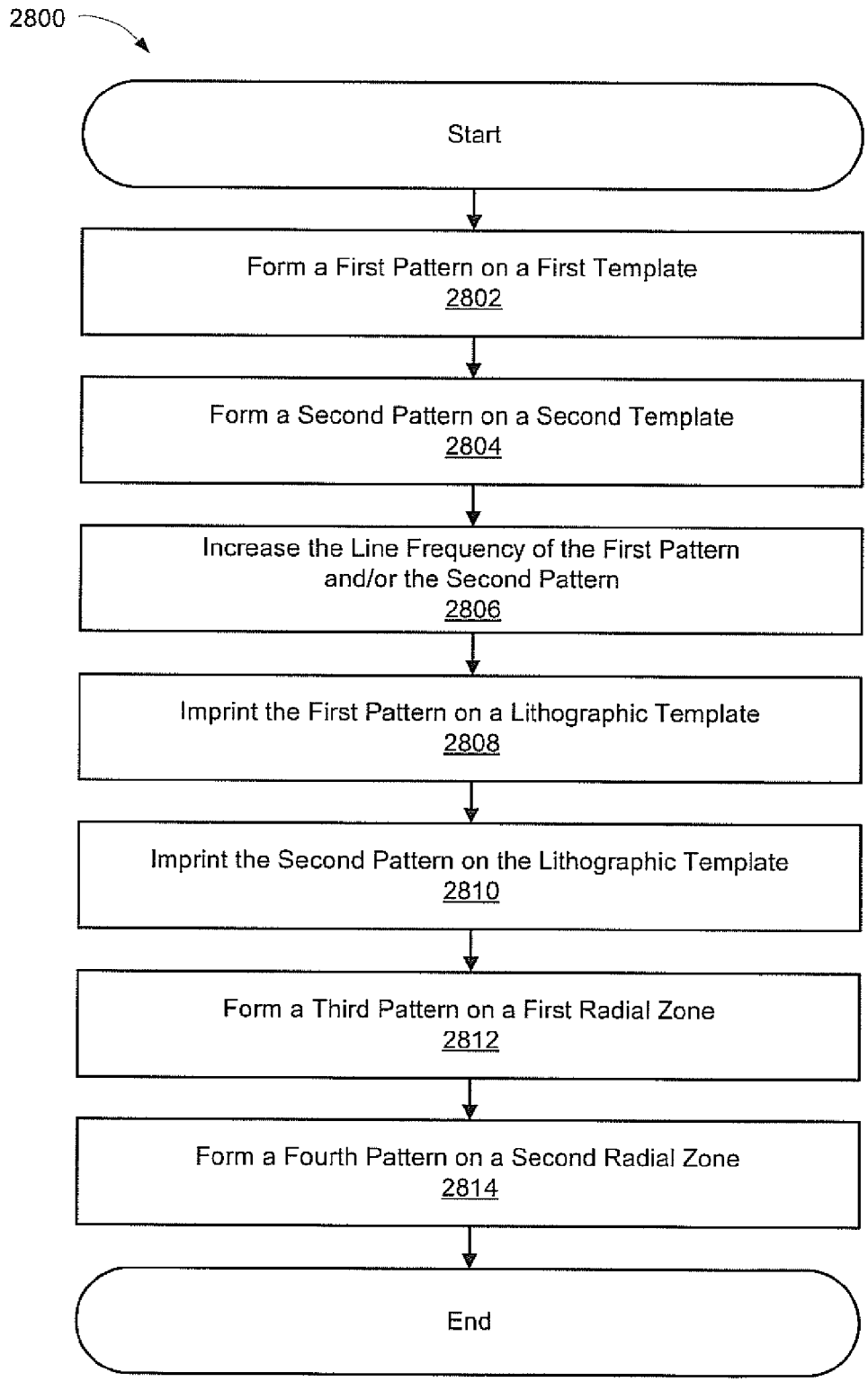
FIG. 28 depicts a flowchart of an exemplary method of imprint lithography according to an embodiment of the present invention.

FIG. 28 depicts a flowchart 2800 of an exemplary method of imprint lithography according to an embodiment of the present invention. Although specific steps are disclosed in the flowchart, such steps are exemplary. That is, embodiments of the present invention are well-suited to performing various other steps or variations of the steps recited in the flowchart.

In block 2802, a first pattern is formed on a first template. For example, in FIG. 6 a concentric line pattern has been formed on a template by thin film deposition.

In block 2804, a second pattern is formed on a second template. For example, in FIG. 22 the radial line template used was a positive oblique radial line template with positive radial line features. However, in FIG. 23 the radial line template used was a negative oblique radial line template with negative radial line features.

In block 2806, line frequency is increased on the first template and/or the second template by frequency increasing. For example, in FIG. 16 frequency increasing has increased the line frequency of a line pattern. In FIG. 17 frequency increasing was used to increase the line density of the first concentric line pattern on the template. In FIG. 18 frequency increasing was used to increase the line density of the second radial line pattern on the template.

In block 2808, the first pattern is imprinted with the first template on a first substrate of a lithographic template. For example, in FIG. 22 a first concentric line pattern template was used to form a concentric line pattern on a perpendicular magnetic recording media template.

In block 2810, the second pattern is imprinted with the second template on the substrate of the lithographic template. The first pattern and the second pattern at least partially overlap, and the first pattern and the second pattern form a third pattern. For example, in FIG. 22 a second radial line pattern template was used to transfer a radial line pattern to the perpendicular magnetic recording media template. The first concentric line pattern and the second radial line pattern partially overlap, thus forming a third pattern on the perpendicular magnetic recording media template. In an alternate embodiment the radial line pattern is formed first and the concentric line pattern is formed second.

In a block 2812, the third pattern is formed on a first radial zone on a second substrate with the lithographic template. For example, in FIG. 25 a perpendicular magnetic recording medium has been divided into radial zones. The perpendicular magnetic recording media template imprints the third pattern in the first zone on the perpendicular magnetic recording media. In an embodiment, the third pattern lithographically forms perpendicular magnetic recording islands on the perpendicular magnetic recording media.

In a block 2814, a fourth pattern is formed on a second radial zone on the second substrate. In an embodiment, the fourth pattern is formed with a second lithographic template, however in an alternate embodiment the fourth pattern may be formed on the first lithographic template. For example, in FIG. 25 the second radial zone may be imprinted with a fourth pattern that has been formed on a second lithographic template. In an embodiment, the fourth pattern lithographically forms perpendicular magnetic recording islands on the perpendicular magnetic recording media.

In addition, in an embodiment the third pattern and/or the fourth pattern may be skewed to accommodate head skew effects. For example, in FIG. 26 the pattern has been skewed to accommodate the head skew effects experienced by the head.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A method comprising:
  imprinting a first pattern with a first template on a first substrate of a lithographic template;
  imprinting a second pattern with a second template on said first substrate of said lithographic template, wherein:
    said first pattern and said second pattern at least partially overlap; and
    said first pattern and said second pattern form a third pattern; and
  lithographically forming said third pattern on a second substrate with said lithographic template.

2. The method of claim 1 wherein at least one of said imprinting a first pattern or said imprinting a second pattern comprises imprinting a concentric line pattern.

3. The method of claim 1 wherein at least one of said imprinting a first pattern or said imprinting a second pattern comprises imprinting a radial line pattern.

4. The method of claim 1 wherein lithographically forming said third pattern on a second substrate comprises lithographically forming perpendicular magnetic recording islands.

5. The method of claim 1 further comprising increasing line frequency on at least one of said first template or said second template.

6. The method of claim 1:
  wherein said lithographically forming said third pattern on a second substrate with said lithographic template comprises lithographically forming said third pattern on a first radial zone on said second substrate with said lithographic template, and further comprising lithographically forming a fourth pattern on a second radial zone on said second substrate.

7. The method of claim 6 further comprising skewing at least one of said third pattern or said fourth pattern to accommodate head skew effects.

8. A method comprising:
increasing line density of a second pattern in comparison to line density of a first pattern;
transferring said second pattern to a perpendicular magnetic recording media template, wherein:
said second pattern at least partially overlaps said first pattern on said perpendicular magnetic recording media template, and
said first pattern and said second pattern form a third pattern on said perpendicular magnetic recording media template; and
imprinting said third pattern on a perpendicular magnetic recording medium with said perpendicular magnetic recording media template.

9. The method of claim 8 further comprising forming said first pattern on said perpendicular magnetic recording media template with a concentric line pattern template, wherein said concentric line pattern template is formed by a thin film deposition process.

10. The method of claim 8 wherein said transferring said second pattern comprises transferring said second pattern from a positive oblique radial line template or a negative oblique radial line template.

11. The method of claim 8:
wherein said imprinting said third pattern on a perpendicular magnetic recording medium with said perpendicular magnetic recording media template, comprises imprinting said third pattern on a first radial zone of said perpendicular magnetic recording medium with said perpendicular magnetic recording media template, and
further comprising imprinting a fourth pattern on a second radial zone of said perpendicular magnetic recording medium.

12. The method of claim 8 further comprising skewing said third pattern to accommodate head skew effects.

13. A method comprising:
depositing alternating layers of a first material and a second material on a mandrel to form concentric rings around said mandrel;
dicing said mandrel and said alternating layers into a slice;
bonding said slice onto a backing plate; and
removing one of said first material or said second material to form a concentric line pattern.

14. The method of claim 13, further comprising imprinting a perpendicular magnetic recording media template with said concentric line pattern.

15. The method of claim 13, wherein said depositing alternating layers of a first material and a second material comprises depositing alternating layers of said first material and said second material using thin film deposition.

16. The method of claim 13, wherein said depositing alternating layers, comprises depositing alternating layers that are each less than or equal to 2 nm in thickness.

17. The method of claim 13, wherein said removing one of said first material or said second material comprises etching one of said first material or said second material.

18. The method of claim 13, further comprising dicing said mandrel and said alternating layers into a plurality of slices.

19. The method of claim 13, further comprising increasing line density of said concentric line pattern.

\* \* \* \* \*